(12) United States Patent
Chang et al.

(10) Patent No.: US 8,816,327 B2
(45) Date of Patent: Aug. 26, 2014

(54) NANOWIRE EFUSES

(75) Inventors: Josephine B. Chang, Mahopac, NY (US); Isaac Lauer, Mahopac, NY (US); Chung-Hsun Lin, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/611,081

(22) Filed: Sep. 12, 2012

(65) Prior Publication Data
US 2013/0106496 A1   May 2, 2013

Related U.S. Application Data

(63) Continuation of application No. 13/286,725, filed on Nov. 1, 2011.

(51) Int. Cl.
  *H01L 29/06*   (2006.01)
  *H01L 29/78*   (2006.01)
  *H01L 23/525*  (2006.01)

(52) U.S. Cl.
  CPC .......... *H01L 29/785* (2013.01); *H01L 23/5256* (2013.01)
  USPC ..................... 257/24; 257/E21.415

(58) Field of Classification Search
  CPC ... H01L 23/5256; H01L 29/785; H01L 7/112; H01L 27/11206; H01L 2924/3011
  USPC ................. 438/132, 281, 333, 467, 600, 601; 257/24, 347, E21.415, E29.286, 257/E29.168
  See application file for complete search history.

(56) References Cited

U.S. PATENT DOCUMENTS

| | | | |
|---|---|---|---|
| 7,446,025 B2 | 11/2008 | Cohen et al. | |
| 2010/0164110 A1 | 7/2010 | Jin et al. | |
| 2011/0133162 A1 | 6/2011 | Bangsaruntip et al. | |
| 2011/0133167 A1 | 6/2011 | Bangsaruntip et al. | |
| 2012/0001295 A1* | 1/2012 | Kurz et al. .................... | 257/529 |

OTHER PUBLICATIONS

Kamins, et al., "Metal-Catalyzed Silicon Nanowires: Control and Connection" Proceedings of 2005 5th IEEE Conference on nanotechnology, Nagoya, Japan, Jul. 2005. (5 pages).
Liu, et al., "Silicidation of Silicon Nanowires by Platinum" Nano Letters, American Chemical Society, Feb. 2007, 7(3), pp. 818-824.
Mohammad, et al., "Fabrication of Cobalt Silicide Nanowire Contacts to Silicon Nanowires" Jounal of the Electrochemical Society, 150(9) pp. 577-580, Jul. 2003.
Tonti, "eFuse Design and Reliability" Integrated Reliability Workshop Final Report, IEEE International Oct. 2008. (3 pages).
Weber, et al., "Silicon-Nanowire Transistors with Intruded Nickel-Silicide Contacts" Nano Letters, Sep. 2006, vol. 6, No. 12, pp. 2660-2666.

* cited by examiner

*Primary Examiner* — Tony Tran
(74) *Attorney, Agent, or Firm* — Tutunjian & Bitetto, P.C.; Vazken Alexanian

(57) ABSTRACT

Electrically programmable fuses and methods for forming the same are shown that include forming a wire between a first pad and a second pad on a substrate, forming a blocking structure around a portion of the wire, and depositing a metal layer on the wire and first and second pads to form a metal compound, wherein the metal compound fully penetrates the portion of the wire within the blocking structure.

1 Claim, 6 Drawing Sheets

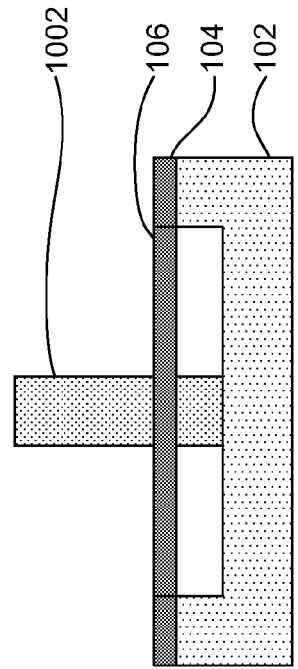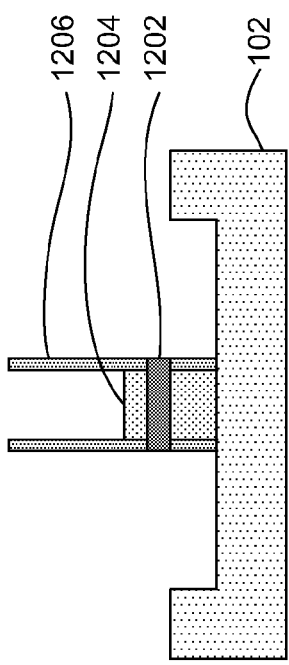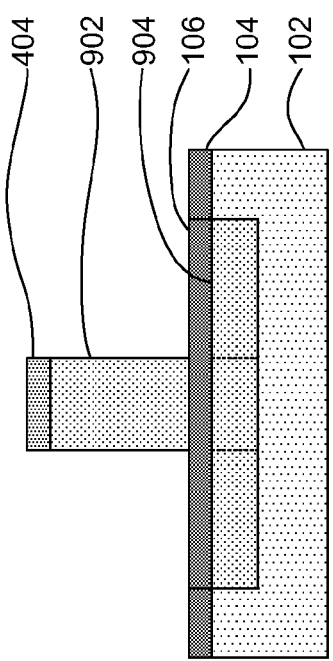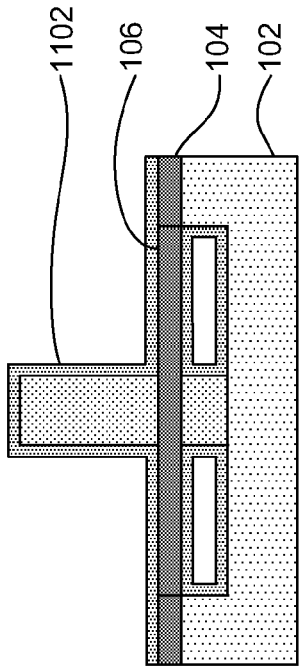
FIG. 9
FIG. 10
FIG. 11
FIG. 12

NANOWIRE EFUSES

RELATED APPLICATION DATA

This application is a Continuation application of co-pending U.S. patent application Ser. No. 13/286,725 filed on Nov. 1, 2011, incorporated herein by reference in its entirety.

BACKGROUND

1. Technical Field

The present invention relates to electrically programmable fuses and, and more particularly to electrically programmable fuses formed on nanowire structures.

2. Description of the Related Art

Electrically programmable fuses (efuses) employ electromigration effects to change the resistance of a circuit element. They stand distinct from laser-blown fuses, where a laser is used to modify the fuse structure. For example, applying a high voltage to an efuse changes the structure of the fuse, thereby programming or "blowing" the fuse. Efuses are advantageous over laser fuses because of the smaller chip area required and the fact that no special equipment (e.g., a laser tool) is needed to program them.

Efuses can be particularly useful in allowing one-time setting of circuit states. For example, efuses may be used to set a serial number or to remove defective memory components from an array. However, existing efuse technologies have difficulty producing a fully "open" circuit, resulting instead in partially "blown" fuses.

SUMMARY

An exemplary method for forming an electrically programmable fuse is shown that includes forming a wire between a first pad and a second pad on a substrate; forming a blocking structure around a portion of the wire; and depositing a metal layer on the wire and first and second pads to form a metal compound, wherein the metal compound fully penetrates the portion of the wire within the blocking structure.

An exemplary method for forming an electrically programmable fuse is shown that includes forming a wire between a first pad and a second pad on a substrate; forming a blocking structure around a portion of the wire; removing a portion of the wire not covered by the blocking structure; epitaxially growing access pads on each end of the portion of the wire; and depositing a metal layer on the access pads to form a metal compound, wherein the metal compound fully penetrates the portion of the wire within the blocking structure.

An exemplary electrically programmable fuse is shown that includes a conducting wire connecting a first pad and a second pad, the conducting wire having a fully conducting cross-section, where the first pad and second pad provide an external electrical connection to the wire; and a blocking structure formed around a portion of the wire, wherein the silicide wire is configured to break by electromigration so as to produce an electrical open when a threshold electrical signal is applied across the first and second pads.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 9 is a cross-sectional view of a first blocking structure etching stage in creating a padless electrically programmable fuse in accordance with the present principles;

FIG. 10 is a cross-sectional view of a second blocking structure etching stage in creating a padless electrically programmable fuse in accordance with the present principles;

FIG. 11 is a cross-sectional view of a spacer formation stage in creating a padless electrically programmable fuse in accordance with the present principles;

FIG. 12 is a cross-sectional view of a nanowire removal formation stage in creating a padless electrically programmable fuse in accordance with the present principles;

DETAILED DESCRIPTION OF PREFERRED EMBODIMENTS

Figure 1:
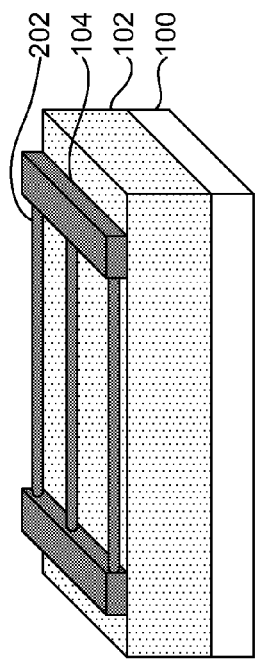
FIG. 1 is a perspective view of a first stage in creating an electrically programmable fuse in accordance with the present principles.

Generally, electromigration is the movement of a conducting material that is caused by the flow of ions in the material when conducing electrons interact with diffusing metal atoms, resulting in a momentum transfer. In layman's teens, electromigration is caused by the electrons "dragging" the conducting material along with them as they move. Electromigration is a significant source of degradation in small-scale and high-voltage electronics, but this otherwise destructive effect can be employed to produce effective electrically programmable fuses (efuses).

The present principles allow for the deposition of a conducting layer on a nanowire. In an exemplary embodiment, the conducting layer may be a silicide or germicide and the nanowire may be formed from silicon. Other possibilities for the nanowire material include pure germanium or SiGe. A deposition process is used that causes the conducting layer to infiltrate and/or replace the nanowire, such that a high voltage or current will cause electromigration effects that break the wire, creating an electrical "open." The present principles provide several such deposition methods which may be used separately or in combination. The present principles are described with respect to a pad nanowire process as well as to a padless nanowire and process for making the same. Although these two embodiments are described in detail, it is contemplated that the present principles may be applied to any nanowire device. Nanowire efuses formed according to the present principles may be formed as part of a standard chip formation process.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, a first step toward forming an exemplary nanowire efuse in a pad process is shown. The structure may include any substrate material including a silicon-on-insulator (SOI) structure and/or composite materials and may be formed with a substrate 100 and a dielectric layer 102 formed on the substrate 100. A semiconductor layer 101 may be formed on the dielectric layer 102 to be patterned and processed to form pads 104 and conducting wires 106. The substrate 100 may include, for example, silicon, gallium arsenide, germanium, etc. The dielectric layer 102 may be formed from a buried oxide, e.g., silicon dioxide. The use of nanowires is explicitly contemplated, though other size wires may be employed. In this illustrative example, a pattern is the same used to form gate-all-around nanowire field effect transistors (FETs) and may therefore be formed as part of the same process as is used in forming such FETs. In one illustrative embodiment, the pads 104 and conducting wires 106 may be illustratively formed by etching a deposited layer on the dielectric layer 102 on a bulk or other material substrate. The structures 104 and 106 may be formed using lithography and etching such as, for example, reactive ion etching (RIE). The particular etch process will depend on the particular materials used and may be selected accordingly by those having ordinary skill in the art.

Figure 2:
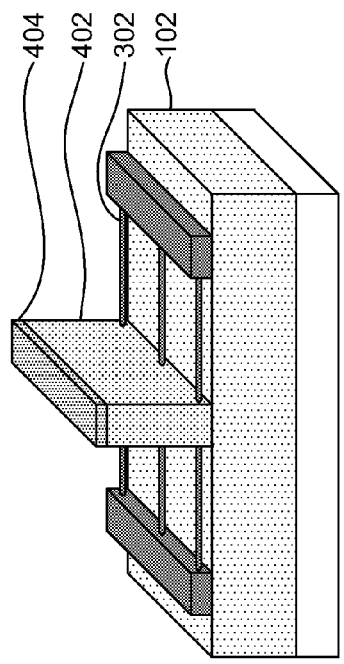
FIG. 2 is a perspective view of a nanowire etching stage in creating an electrically programmable fuse in accordance with the present principles.

Referring now to FIG. 2, the wires 202 are shown after having been separated from the dielectric layer 102. Separation of the wires 202 may be accomplished using an isotropic etch process to remove some of the dielectric layer 102 underneath the patterned wires 106. The lateral etch suspends the wires 106 above the dielectric layer 106 and may illustratively be performed using diluted hydrofluoric acid (DHF). A 100:1 DHF etches about 2-3 nm of buried oxide per minute at room temperature. Following the etch, wires 106 may be smoothed to form wires 202 that are suspended above the dielectric layer 102 by the pads 104. An example of such a smoothing process is hydrogen annealing, though it is contemplated that any smoothing process may be performed. Exemplary annealing temperatures may be between about 600° C. and about 1000° C., with a hydrogen pressure of about 600 torr to about 700 torr.

Figure 3:
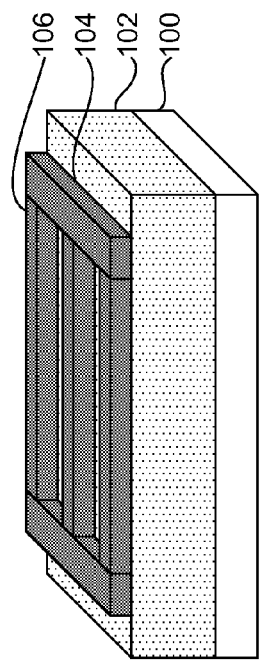
FIG. 3 is a perspective view of a nanowire thinning stage in creating an electrically programmable fuse in accordance with the present principles.

Referring now to FIG. 3, further thinning may be performed to produce a narrower wire 302. If the maskless thinning/smoothing described above produced a sufficiently thin wire 202, then this step may be skipped. However, there are practical limits to how small hydrogen annealing can make a structure, and so further reducing the smoothed wires 202 (e.g., 20 nm in diameter) to produce narrow wires 302 (e.g., 3 nm in diameter) may be advantageous. This further narrowing may be accomplished using a high temperature oxidation process, followed by etching. Oxidation and etching may be repeated to achieve desired dimensions for the wires 302. Although the present principles contemplate that any cross section for the wires 302 may be used, a cylindrical nanowire is used herein for the purpose of illustration.

Figure 4:
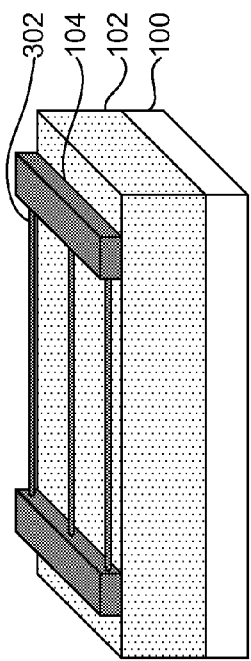
FIG. 4 is a perspective view of a blocking structure stage in creating an electrically programmable fuse in accordance with the present principles.

Referring now to FIG. 4, a blocking structure 402 is formed over and around the nanowires 302. The blocking structure 402 may be formed as part of a process that forms, e.g., gates on other structures on the same chip (e.g., field effect transistors) (not shown). This allows the present efuses to be formed without the need for a separate formation process. The blocking structure 402 may be formed by depositing, e.g., polysilicon over the dielectric layer 102 and wires 302 with a hardmask layer 404 on top of the blocking structure 402. The hardmask layer 404 may be formed from, e.g., a silicon nitride such as $Si_3Ni_4$. A directional (anisotropic) RIE may then be used to etch the blocking structure 402 to produce straight sidewalls. This may leave blocking material underneath the wires 302, so an isotropic RIE process may be used to clear that material away without substantially diminishing the size of the blocking structure 402. Any number of blocking structures 402 may be added to the wires 302 to conform to the processing steps of nearby circuit elements, but such structures do not affect the formation of an efuse and are therefore not shown herein. In further conformance with nanowire FET formation processes, a gate stack (not shown) may be formed around the wires within the blocking structure 402.

Figure 5:
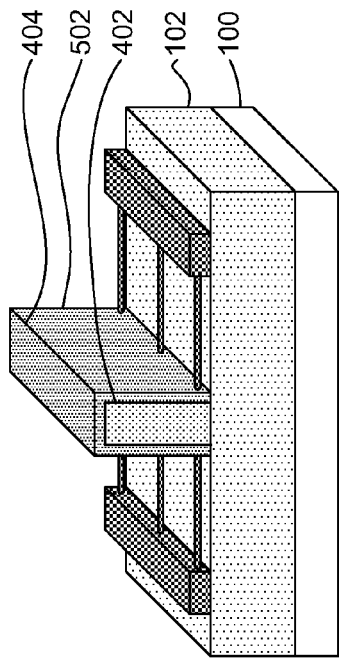
FIG. 5 is a perspective view of a spacer formation stage in creating an electrically programmable fuse in accordance with the present principles.

Referring now to FIG. 5, a spacer 502 may be added. Spacer material, such as a silicon nitride, is deposited on exposed surfaces and etched from all horizontal surfaces using, e.g., RIE. In this way, spacer 502 is formed along the sidewall of the blocking structure 402, which may, for example, be a gate structure. As compared to the formation of, e.g., field effect transistors, the spacer 502 may be made particularly thin or even omitted entirely. For example, whereas a typical FET may have a spacer on the order of 6-15 nm, the present efuse spacers may be on the order of 3-5 nm. This makes later formation of the fuse easier, as the spacer covers a portion of the wire 302. As such, minimizing the coverage allows greater access for silicidation, if layer 104 includes silicon.

At this point, process flows for FET formation often include a step of source and drain epitaxy to increase the thickness of pads and exposed wires. While this would be desirable in a context where electromigration would degrade the finished product, in the present case, thickening the wires would only make it more difficult to make the efuse conductive through its full cross section. As such, it is advantageous to skip the silicon epitaxy on efuse regions if such a step is used for other features on the chip.

Figure 15:
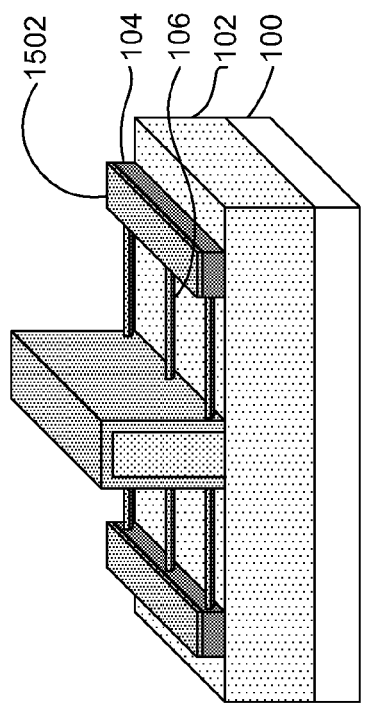
FIG. 15 is a perspective view of a hardmask stage in creating an electrically programmable fuse in accordance with the present principles.

Referring now to FIG. 15, an optional stage of masking the nanowire regions is shown. A hardmask 1502, e.g., a silicon nitride, is applied to all exposed regions of the pads 104 and wires 302. The hardmask 1502 prevents additional silicon growth. After the epitaxy finishes, the hardmask 1502 may be removed.

Figure 6:
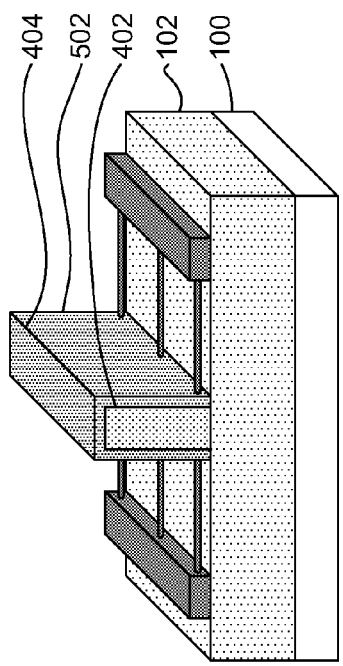
FIG. 6 is a perspective view of a metal layer formation stage in creating an electrically programmable fuse in accordance with the present principles.

Referring now to FIG. 6, a metal layer 602 is deposited onto the exposed conducting wires 106 and pads 104. The hardmask 404 and the spacer 502 do not react with the metal layer 602. The metal layer 602 may be formed from a transition metal, such as titanium, cobalt, nickel, platinum, or tungsten or from alloys such as NiPt, and may have an exemplary thickness on the order of about 3 to about 9 nm. Optionally, a second deposition may be made to thicken the metal layer, adding an additional 5-10 nm of metal on efuse regions. In the case of silicon nanowires, an additional metal layer helps to enable full silicidation of the nanowires 106. When nickel is used, a NiSi phase is formed due to its low resistivity. Relatively low temperatures, in the exemplary range of about 400 to about 600° C., may be used at this stage. This temperature is highly dependent on the type of metal used. For example, nickel uses a temperature range of about 400 to about 500° C., cobalt uses a temperature of about 600°, and Nickel uses temperatures of about 800° C. or more. Annealing times range from about ten seconds to several minutes, depending on the material used and the temperature. Once the silicide is formed, capping layers and vias for connectivity (not shown) may be formed.

Figure 7:
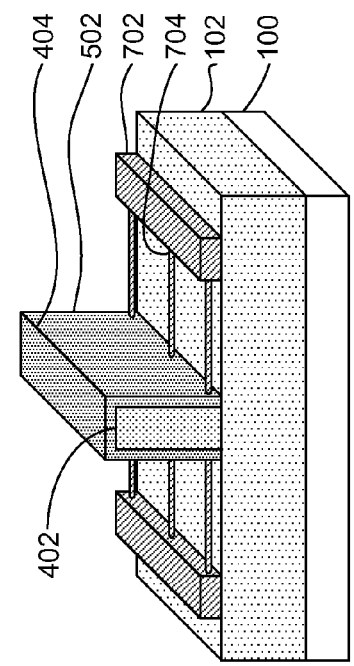
FIG. 7 is a perspective view of a silicidation stage in creating an electrically programmable fuse in accordance with the present principles.

Referring now to FIG. 7, an illustrative embodiment is shown where heat is applied to the metal layer 602, causing it to react with an underlying material to form a conductive compound. For the purpose of illustration, a silicide may be formed, but this is not intended to be limiting. Any suitably conducting compound may be formed. Preferably, metal layer 602 is applied thickly enough to allow for full infiltration of the conducting wires 106, including into the portion of wire 106 covered by blocking structure 402. Electrical contract can be made to pads 702, such that conducting wires 704 form an electrical connection between the two sides after the illustrative silicide is formed.

When low voltage is applied, the wires 704 conduct normally, representing, for example, one binary state. When high voltage is applied, however, electromigration causes the conducting material to move in the direction of electron movement (i.e., against the direction of current). The threshold at which electromigration becomes significant will depend on the dimensions of the nanowires, the materials used, and, e.g., the proportion of metal used. Because the wires 704 have been fully infiltrated by metal, this electromigration may result in a complete severing of the wires 704, resulting in an electrical "open" state. In this way, the wires 704 form an efuse that may be programmed, or "blown," once, allowing the state to be permanently set.

An efuse may be used in any context where a device or part of a device is to be permanently enabled or disabled. For example, an efuse may be employed to selectively disable memory cells in a memory array when those cells become defective. Efuses may further be used as a form of write-once memory, encoding, for example, a device serial number. This list of applications is included solely for illustration and is not meant to be limiting—other applications are also contemplated.

An alternative embodiment involves a "padless" arrangement, whereby wires do not extend beyond the blocking material. This type of efuse may be used when padless circuit elements are used elsewhere on the chip, so as to simplify design and formation. This type of efuse may be employed in chips where padless FETs are formed to simplify the overall patterning process.

Figure 8:
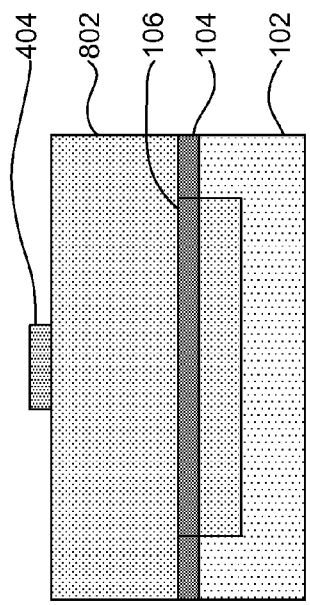
FIG. 8 is a cross-sectional view of a first stage in creating a padless electrically programmable fuse in accordance with the present principles.

Referring now to FIG. 8, a side view of FIG. 3 is shown after blocking material 802 has been filled in. The blocking material 802 fills over the conducting wires 106 and pads 104, as well as the space between the conducting wires 106 and the dielectric layer 102. The hardmask 404 is patterned on top to define the position, size, and shape of the eventual blocking structure. Blocking material 802 may be amorphous silicon, providing hydrofluoric acid resistance.

Referring now to FIG. 9, an anisotropic etch is performed using, for example, RIB, to remove exposed blocking material. The portion of blocking material 902 which was under the hardmask 404 remains, as does the portion of blocking material 904 which was under the conducting wires 106.

Referring now to FIG. 10, the hardmask 404 is removed and an isotropic etch is performed. The isotropic etch removes blocking material under the wires, producing a blocking structure 1002 of uniform width. The blocking structure 1002 establishes the location of the final efuse and supports the ultimate efuse structure. The blocking structure 1002 may be formed from, e.g., polysilicon.

Referring now to FIG. 11, spacer material 1102 is added. The spacer 1102 may be formed by depositing a dielectric film, such as silicon nitride, using a deposition process such as low-pressure chemical vapor deposition. As compared to the formation of, e.g., field effect transistors, the spacer 1102 may be made particularly thin to aid in silicide penetration.

Referring now to FIG. 12, RIE is used to etch away the spacer material 1102. A selective etch may be used to remove the pads 104 and any conducting wire 106 which is not covered by vertical blocking structure 1204 or spacer 1206 material, leaving buried nanowire 1202. The selective etch may, for example, be an RIE based on HBr chemistry that removes silicon while reducing the etching of dielectrics such as silicon oxide and silicon nitride.

Figure 13:
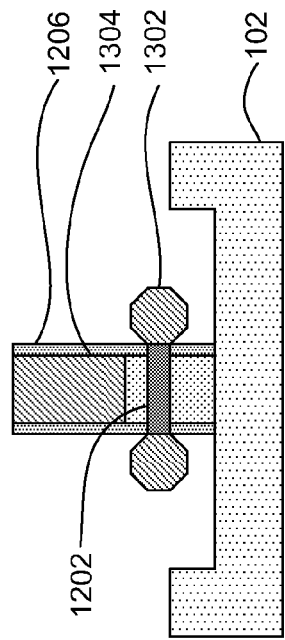
FIG. 13 is a cross-sectional view of a source/drain formation stage in creating a padless electrically programmable fuse in accordance with the present principles.

Referring now to FIG. 13, doped silicon is epitaxially grown. The doped silicon may, for example, include in-situ germanium doped silicon or any other suitable dopant and may be p-doped or n-doped as appropriate. Epitaxial growth may be performed, e.g., using chemical vapor deposition (CVD). Precursors for silicon epitaxy include $SiCl_4$, $SiH_4$ combined with HCl. The use of chlorine allows selective deposition of silicon only on exposed silicon surfaces. A precursor for SiGe may be $GeH_4$, which may obtain deposition selectivity without HCl. Precursors for dopants may include $PH_3$ or $AsH_3$ for n-type doping and $B_2H_6$ for p-type doping. Deposition temperatures may range from about 550° C. to about 1000° C. for pure silicon deposition, and as low as 300° C. for pure Ge deposition.

Doped silicon 1304 fills the gap between spacers 1206, without producing an epitaxial "mushroom" at the top. Doped silicon is not necessary for the formation of a functioning efuse, but if neighboring FET devices use such a step it may be optionally incorporated into the efuse to simplify the formation process. If there is any overgrowth, chemical mechanical planarization may be used to make the doped silicon 1304 even with the spacers 1206. Additional doped silicon 1302 is epitaxially grown from the ends of the buried nanowire 1202, representing source and drain regions.

Figure 14:
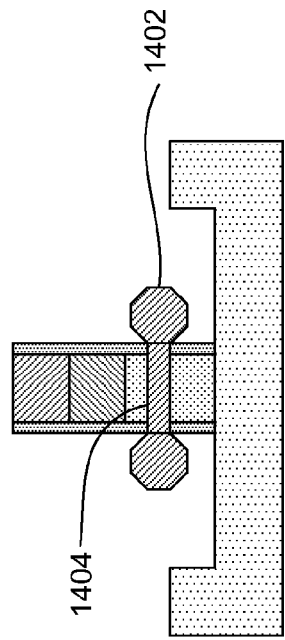
FIG. 14 is a cross-sectional view of a silicidation stage in creating a padless electrically programmable fuse in accordance with the present principles.

Referring now to FIG. 14, silicide formation is shown. A transition metal, such as titanium, cobalt, nickel, platinum, or tungsten, or alloys such as NiPt, is deposited over the doped silicon surfaces 1302 and 1304. When, for example, nickel is applied, a phase of NiSi is formed due to its low resistivity. This can be accomplished at relatively low temperatures in an exemplary range between about 400 to about 600° C. The metal thereby infiltrates the doped silicon 1302 and silicon nanowire 1202 to form a silicide source/drain 1402 and fuse 1404. Electrical contacts may be made to the source/drain regions 1402.

As with the pad-inclusive embodiment described above, the padless efuse allows the state to be "programmed" once by applying a high voltage or current across the efuse 1402. Electromigration in the thin silicide nanowire 1402 causes the wire to break, creating an electrical open and changing a binary state. As above, the threshold programming voltage will depend on the precise dimensions and materials used and may be determined by those having ordinary skill in the art.

Figure 16:
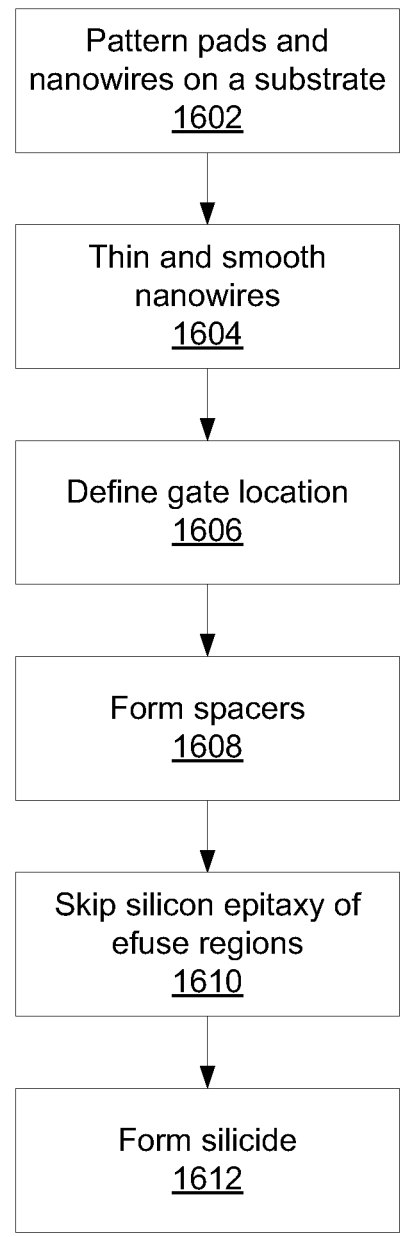
FIG. 16 is a block/flow diagram an electrically programmable fuse process in accordance with the present principles.

Referring now to FIG. 16, a process flow for creating a pad-based efuse is shown. Pads 104 and conducting wires 106 are patterned onto a dielectric substrate 102 at block 1602. Block 1604 smooths and thins the conducting wires 106. The smoothing and thinning may optionally be performed as two separate steps, or may be performed in a single step if the smoothing process produces sufficiently thin wires. Block 1606 defines a blocking structure location by putting blocking material 402 over and around the nanowires 302. As noted above, the creation of a blocking structure 402 is not needed for the functionality of the efuse, but may be performed to conform to the process flow for other components on the same chip. For example, if nearby transistors are formed using a blocking structure, block 1606 would then also be used.

Block 1608 forms spacers 502 along the sidewalls of the blocking structure 402. In accordance with the present principles, these spacers 502 may be made thinner than the spacers of other devices on the chip, or they may be omitted entirely. This makes it easier to reach the portion of the nanowires 302 that are covered by blocking structure 402 during silicidation. As with the blocking structure 402, the spacers 502 are not needed for the functioning of the efuse but are included to conform to the process flow for other components nearby.

Block 1610 assumes that source/drain epitaxy is being performed on nearby devices. If this is not the case, then block 1610 may be skipped entirely. Block 1610 occludes the pads 104 and the nanowires 302 with a hardmask 1502 to protect them from the epitaxy being performed on other devices. Block 1610 may then remove the hardmask 1502 after the epitaxy has been completed.

After the hardmask 1502 is removed, block 1612 forms silicide in the nanowires 302 and pads 104. Silicide is formed by applying a metal to the silicon surface and allowing it to infiltrate the silicon. Sufficient metal should be applied to penetrate the entire cross section of the nanowires 302 and to reach the portions of the nanowires 302 that are covered by blocking structure 402.

Figure 17:
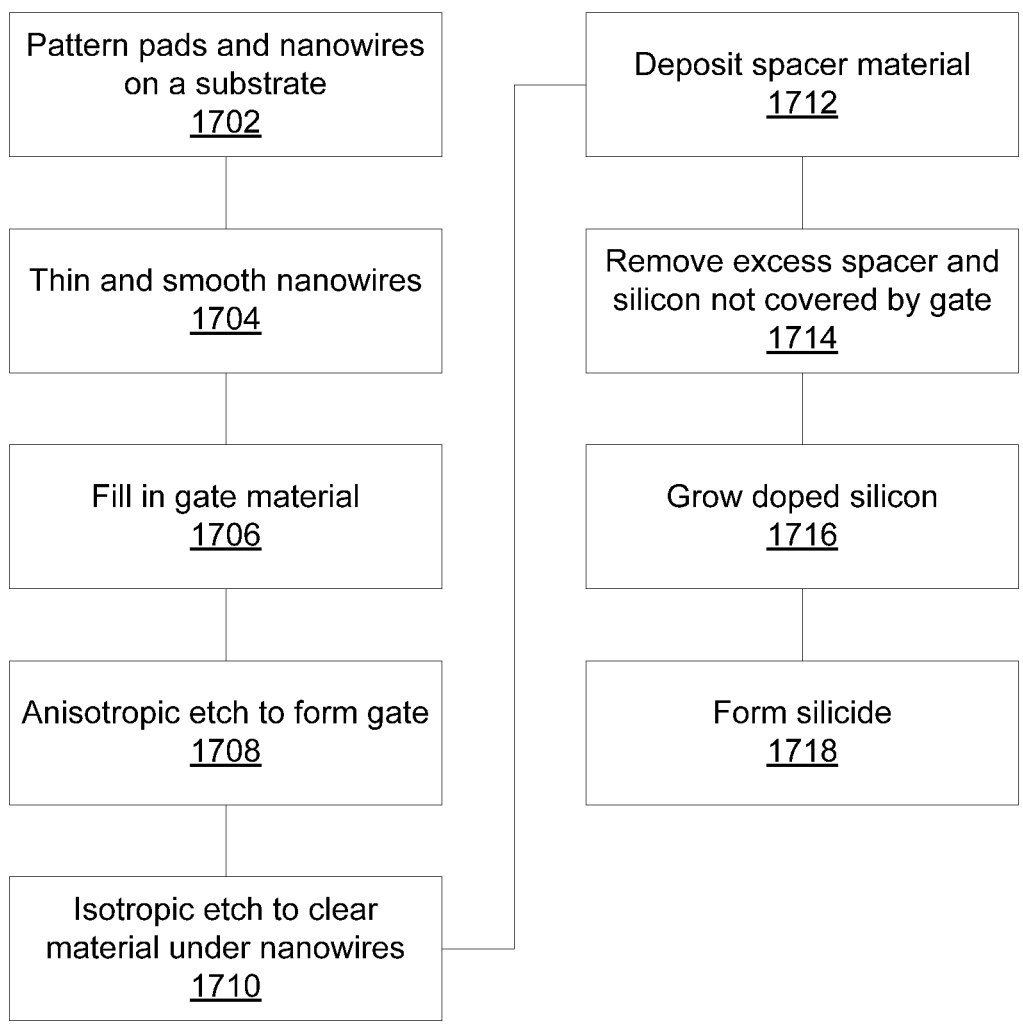
FIG. 17 is a block/flow diagram a padless electrically programmable fuse process in accordance with the present principles.

Referring now to FIG. 17, a process flow for creating a padless efuse is shown. As above with respect to FIG. 16, block 1702 forms pads 104 and conducting wires 106 on a dielectric substrate 102. Block 1704 thins and smooths the nanowires. Block 1706 fills in blocking material 802, such as amorphous silicon, and block 1708 anisotropically etches away blocking material 802 to form blocking structure 902. Because some material 904 is left under the conducting wires 106, block 1710 isotropically etches the material further, reducing blocking structure 902 slightly in size to form blocking structure 1002 and removing leftover material 904.

Block 1712 deposits spacer material 1102 over all exposed surfaces. Block 1714 then removes excess spacer material 1102 as well as pads 104 and the portions of the conducting wires 106 that extends beyond the remaining spacer 1206. This leaves a padless nanowire 1202 within the remaining blocking material 1204. At this point, block 1716 epitaxially grows doped silicon, e.g., SiGe, over the remaining blocking material 1204 and at the ends of the padless nanowire 1202 to form source and drain regions 1302. This step may also include planarization of any overgrowth of the doped silicon in the blocking region 1304. Block 1718 forms a silicide by applying a metal layer on the doped silicon surfaces 1304 and 1302 and allowing the metal to penetrate the source and drain regions 1302 and the padless nanowire 1202. This forms the padless efuse 1404.

Having described preferred embodiments of a nanowire efuse and methods for forming the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An electrically programmable fuse, comprising:
a conducting wire connecting a first pad and a second pad disposed at respective ends of the conducting wire, the conducting wire having a completely silicide cross-section, such that the entire cross-section is formed from silicide, where the first pad and second pad provide an external electrical connection to the wire; and
a blocking structure formed around a full circumference of a portion of the wire, wherein the blocking structure comprises a spacer, wherein the completely silicide cross-section is within the region covered by the blocking structure, and wherein the conducting wire is disposed entirely within the blocking structure,
wherein the conducting wire is configured to break by electro-migration into two regions so as to produce an electrical open when a threshold electrical signal is applied across the first and second pads.

\* \* \* \* \*